United States Patent [19]
Pinarbasi

[11] Patent Number: 6,063,244
[45] Date of Patent: May 16, 2000

[54] DUAL CHAMBER ION BEAM SPUTTER DEPOSITION SYSTEM

[75] Inventor: Mustafa Pinarbasi, Morgan Hill, Calif.

[73] Assignee: International Business Machines Corporation, Armonk, N.Y.

[21] Appl. No.: 09/083,372

[22] Filed: May 21, 1998

[51] Int. Cl.[7] .................................................. C23C 19/34
[52] U.S. Cl. ................................ 204/192.11; 204/192.2; 204/298.25; 204/298.26; 204/298.04
[58] Field of Search ........................... 204/192.11, 192.2, 204/298.04, 298.25, 298.23, 298.26, 298.28, 192.17, 192.15; 427/127, 128, 131; 118/729, 730, 733

[56] References Cited

U.S. PATENT DOCUMENTS

| | | | |
|---|---|---|---|
| 4,663,009 | 5/1987 | Bloomquist et al. | 204/192.2 |
| 4,923,585 | 5/1990 | Krauss et al. | 204/298.04 |
| 5,080,455 | 1/1992 | King et al. | 359/350 |
| 5,206,590 | 4/1993 | Dieny et al. | 324/252 |
| 5,340,261 | 8/1994 | Oosawa et al. | 414/217 |
| 5,454,919 | 10/1995 | Hill et al. | 204/192.11 |
| 5,465,185 | 11/1995 | Heim et al. | 360/113 |
| 5,492,605 | 2/1996 | Pinarbasi | 204/192.11 |
| 5,492,720 | 2/1996 | Gill et al. | 427/131 |
| 5,611,861 | 3/1997 | Higashi | 118/719 |
| 5,612,098 | 3/1997 | Tan et al. | 427/529 |
| 5,662,785 | 9/1997 | Schertler | 204/298.25 |
| 5,783,055 | 7/1998 | Kamei et al. | 204/298.04 |

FOREIGN PATENT DOCUMENTS

| | | | |
|---|---|---|---|
| 0751499A1 | 1/1997 | European Pat. Off. | G11B 5/39 |
| 8-129721 | 5/1996 | Japan | G11B 5/39 |

OTHER PUBLICATIONS

T.C. Anthony et al., "Magnetoresistance of Symmetric Spin Valve Structures", IEEE Transactions on Magnetics, vol. 30, No. 6, Nov. 1994, pp. 3819–3821.

S.F. Cheng et al., Factors Affecting Performance of NiO Biased Giant Magnetoresistance Structures:, Journal of Applied Physics, vol. 79, No. 8, Apr. 15, 1996, pp. 6234–6236.

B.A. Everitt et al., "Spin Valves with NiO Pinning Layer", IEEE Transaction on Magnetics, vol. 32, No. 5, Sep. 1996 pp. 4657–4659.

H. Hoshiya et al., "Giant Magnetoresistance of Spin Valve Films with NiO Antiferromagnetic Films", Journal of the Magnetism Soceity of Japan, vol. 18, No. 2, 1994, pp. 355–359.

R.P. Michel et al., "NiO Exchange Bias Layers Grown by Direct Ion Bean Sputtering of a Nickel Oxide Target", IEEE Transactions on Magnetics, vol. 32, No. 5, Sep. 1996, pp. 4651–4653.

J.X. Shen et al., "Exchange Coupling Between NiO and NiFe Thin Films", Journal of Applied Physics, vol. 79, No. 8, Apr. 15, 1996, pp. 5008–5010.

*Primary Examiner*—Nam Nguyen
*Assistant Examiner*—Julian A. Mercado
*Attorney, Agent, or Firm*—William D. Gill

[57] ABSTRACT

A dual chamber deposition system comprising two ion beam sputtering (IBS) deposition chambers connected by a wafer handler chamber for depositions of multilayer thin film structures with improved process throughput. Reactive ion beam sputtering depositions and metal layer depositions on a substrate may be carried out in separate IBS deposition chambers while maintaining vacuum conditions throughout the process. A process for ion beam sputter deposition of spin valve (SV) magnetoresistive sensor layers having an AFM layer formed of NiO where reactive sputtering deposition of the NiO is carried out in a separate IBS deposition chamber from the subsequent metal layer depositions improves system throughput while maintaining SV sensor performance.

9 Claims, 5 Drawing Sheets

DUAL CHAMBER ION BEAM SPUTTER DEPOSITION SYSTEM

CROSS REFERENCE TO RELATED APPLICATION

The subject matter of this application is related to application Ser. No. 08/862,453 filed on May 23, 1997, now U.S. Pat. No. 5,871,622 owned by a common assignee and having the same inventor as the present invention.

BACKGROUND OF THE INVENTION

1. Field of the Invention

This invention relates generally to the fabrication of thin films by ion beam sputter deposition and, more particularly, to an improved ion beam sputter deposition system for fabrication of multilayered thin film structures such as magnetoresistive sensors and an improved deposition process with increased throughput.

2. Description of Related Art

It is well-known in the prior art to utilize RF or DC magnetron sputter deposition systems for fabrication of thin film devices such as magnetic recording sensors and storage media. Such sputter deposition systems are characterized by crossed electric and magnetic fields in an evacuated chamber into which an inert, ionizable gas, such as argon, is introduced. The gas is ionized by electrons accelerated by the electric field, which forms a plasma in proximity to a target structure. The crossed electric and magnetic fields confine the electrons in a zone between the target and substrate structures. The gas ions strike the target structure, causing ejection of atoms that are incident on a workpiece, typically a substrate on which it is desired to deposit one or more layers of selected target materials.

In the prior art conventional sputtering deposition systems, relatively high operating pressures are utilized in order to obtain films having low internal stress which results in non-directional sputtering flux at the substrate. However, this non-directional flux introduces manufacturing process difficulties as device dimensions become increasingly smaller.

It is known in the prior art to utilize ion beam sputter deposition in certain applications to overcome some of the difficulties encountered with conventional RF/DC sputter techniques. Several aspects of ion beam sputter deposition differ from conventional sputter processes and provide significant advantages. For example, (1) the use of low background pressure results in less scattering of sputtered particles during the transit from the target to the substrate; (2) control of the ion beam directionality provides a variable angle of incidence of the beam at the target; (3) a nearly monoenergetic beam having a narrow energy distribution provides control of the sputter yield and deposition process as a function of ion energy and enables accurate beam focusing and scanning; and (4) the ion beam is independent of target and substrate processes which allows changes in target and substrate materials and geometry while maintaining constant beam characteristics and allowing independent control of the beam energy and current density.

Referring to FIG. 1, a simplified diagram illustrating an ion beam sputter deposition system 100 of the prior art is shown. The ion beam sputter deposition system 100 includes a vacuum chamber 120 in which an ion beam source 121 is mounted. The ion beam sputter deposition system 100 further comprises a selectable multiple targets 123 on a rotary target support 125. An ion beam 133 provided by the ion source 121 is directed at the target 123 where the impacting ions cause sputtering of the target material. The sputtered atoms 126 emitted from the target material are directed onto a deposition substrate (also referred to as a workpiece) 131 on which is formed a layer of the target material.

A thickness monitor 137 positioned closely adjacent to the substrate 131 provides real-time, in-situ monitoring of the thickness of the growing film during deposition. The substrate or other workpiece 131 is mounted on a movable pedestal or support member 141 which is retrieved into a loading port 139 via a gate valve 138 for changing the workpiece 131. A magnetic field may also be applied at the workpiece 131 if required for the particular structure being deposited. The pedestal 141 may also be rotated, using a rotary/linear motor, during deposition to rotate the deposition substrate 131. During operation of the ion beam sputter deposition system, the vacuum chamber 120 is maintained at suitable low pressure by a vacuum pump 160 via port 135 which can be closed by a gate valve 162.

Apparatus and methods for producing a thin film deposit on a substrate utilizing ion beam sputtering are described, for example, in U.S. Pat. Nos. 4,923,585 to Krauss et al. and in U.S. Pat. No. 5,942,605 to Pinarbasi, the contents of which are incorporated herein by reference. Krauss et al. discloses the use of a computer controlled, single ion beam with a quartz crystal monitor to produce deposited films of arbitrary composition as well as layered structures of arbitrary thickness from multiple targets of elemental components of the desired films and layered structures. Pinarbasi discloses matching the ion beam gas atomic mass to the target material atomic mass to provide thin films having densities and physical properties very close to their bulk property values. Both the mass of the ion beam sputtering gas and the energy of the ion beam is controlled as a function of the target material to provide single-layered and multi-layered structures wherein selected properties of each layer are optimized to provide specific function for each layer in the resulting structure.

Ion beam sputter deposition systems have been utilized in the prior art to deposit anisotropic magnetoresistive (AMR) sensors and giant magnetoresistive (GMR) sensors for use in magnetic recording devices. In the GMR sensors, the resistance of the magnetoresistive (MR) sensing layer varies as a function of the spin-dependent transmission of the conduction electrons between the magnetic layers separated by a non-magnetic layer (spacer) and the accompanying spin-dependent scattering which takes place at the interface of the magnetic and non-magnetic layers and within the magnetic layers. GMR sensors using only two layers of ferromagnetic material (e.g., Ni—Fe or Co or Ni—Fe/Co) separated by a layer of GMR promoting non-magnetic metallic material (e.g., copper) are generally referred to as spin valve (SV) sensors.

FIG. 2 shows an air bearing surface view of a prior art SV sensor 200 comprising end regions 204 and 206 separated by a central region 202. A free layer (free ferromagnetic layer) 210 is separated from a pinned layer (pinned ferromagnetic layer) 220 (which may include a very thin Co interface layer 222) by a non-magnetic, electrically-conducting spacer layer 215. The magnetization of the pinned layer 220 is fixed through exchange coupling with an antiferromagnetic (AFM) layer 230 deposited on a substrate 250. The magnetization of the free layer, however, is free to rotate in the presence of an external field. Free layer 210, spacer layer 215, pinned layer 220 and the AFM layer 230 are all formed in the central region 202. Hard bias layers 252 and 254 formed in the end regions 204 and 206, respectively, provide longitudinal bias for the MR free layer 210. Leads 260 and 265 formed over hard bias layers 252 and 254, respectively, provide electrical connections for the flow of the sensing current $I_s$ from a current source 270 to the MR sensor 200. A signal detector 280 which is electrically connected to the leads 260 and 265 senses the change in resistance of the SV sensor 200 due to changes induced by the external magnetic field (e.g., the field generated by a data bit stored on a disk).

The SV sensor 200 in which the AFM layer 230 is formed of NiO is of particular current interest because of the high corrosion resistance properties of NiO. Deposition of such an SV sensor in the ion beam sputter deposition system 100 is carried out by a first deposition process in which reactive ion beam sputtering is used to deposit a substrate layer 250 formed of $Al_2O_3$ and the AFM layer 230 formed of NiO, followed by a second deposition process to deposit metal layers by ion beam sputtering in an inert gas atmosphere. Substrate layer 250 is deposited by ion beam sputtering an aluminum (Al) target in the presence of an oxygen-containing gas to form an $Al_2O_3$ layer. The NiO AFM layer 230 is deposited on the substrate layer 250 by sputtering a nickel (Ni) target in the presence of an oxygen-containing gas to the thickness at which the desired exchange properties are achieved, typically 200–500 Å. The oxygen-containing gas must then be pumped out of the vacuum chamber and the targets sputter cleaned before deposition of the subsequent metal layers. The pinned layer 220 formed of Ni—Fe, spacer layer 215 formed of Cu, free layer 210 formed of Ni—Fe, and cap layer 205 formed of Ta are then sequentially deposited over the NiO AFM layer 230 in the presence of an inert sputtering gas, such as argon.

To obtain good exchange properties between the NiO AFM layer 230 and the pinned ferromagnetic layer 220, the ferromagnetic layer should be deposited on a freshly deposited NiO surface with minimum contamination. Therefore, it is necessary to minimize the hold time, defined as the time between completing the NiO deposition and deposition of the subsequent ferromagnetic layer on the NiO, in order to minimize contamination of the NiO surface.

A problem with the prior art ion beam deposition system is that the hold time between deposition of the NiO layer and the deposition of the pinned ferromagnetic layer on the NiO layer cannot be reduced sufficiently to optimize the exchange properties between the two layers without severely reducing the potential deposition system throughput. The low throughput of the ion beam sputter deposition system due to the long processing time required for each wafer would result in high manufacturing costs of the NiO SV sensors.

Therefore there is a need for an ion beam deposition system and deposition process that minimizes and controls hold time of the NiO AFM layer surface prior to deposition of the pinned ferromagnetic layer resulting in improved SV sensor performance and that increases the deposition system wafer throughput in order to reduce manufacturing costs.

SUMMARY OF THE INVENTION

It is an object of the present invention to disclose a dual chamber deposition system having two ion beam sputter (IBS) deposition chambers connected by a wafer handler chamber that provides the means to introduce wafers (substrates) into either IBS deposition chamber and to move the wafers between IBS deposition chambers under vacuum conditions.

It is another object of the present invention to disclose a dual chamber deposition system in which reactive ion beam sputtering depositions and metal layer depositions can be carried out in separate IBS deposition chambers in order to improve the properties of spin valve sensor layers.

It is a further object of the present invention to disclose a process for ion beam sputter deposition of spin valve sensor layers having an AFM layer formed of NiO wherein the exchange coupling between the AFM layer and the pinned layer is increased by depositing the AFM layer in a first IBS deposition chamber and depositing metal layer on the AFM layer in a second IBS deposition chamber.

It is yet another object of the present invention to disclose a process for ion beam sputter deposition of spin valve sensor layers having an AFM layer formed of NiO wherein the throughput of the ion beam deposition process is improved.

In accordance with the principles of the present invention, there is disclosed a dual chamber deposition system comprising a first IBS deposition chamber, a second IBS deposition chamber and a wafer handler chamber disposed between the first and second IBS deposition chambers. In the preferred embodiment of the present invention, the first and second IBS deposition chambers each include an ion beam source, a rotary target support with multiple targets, a pedestal or substrate support, and vacuum pumps. The wafer handler chamber includes first and second access chambers with vacuum pumps, a wafer aligner, a radial motion linear translator fixed on a rotatable turntable for moving the substrate, and a vacuum pump. The wafer handler chamber is connected to the first and second IBS deposition chambers by gate valves which when open provide access ports for the linear translator to move substrates in to or out of each IBS deposition chamber and when closed provide a vacuum seal between the wafer handler chamber and the first and second IBS deposition chambers.

In the preferred embodiment of the invention, the dual chamber deposition system is configured for deposition on wafers of spin valve sensor layers having an AFM layer formed of NiO. The first IBS deposition chamber is dedicated to reactive sputter depositions in an oxygen containing gas of an $Al_2O_3$ substrate layer and an NiO AFM layer. The second IBS deposition chamber is dedicated to subsequent metal layer sputter depositions in an inert gas atmosphere. This separation of reactive sputter deposition process and metal layer deposition process improves on the use of a single chamber by reducing pump down time, reducing oxygen contamination of the targets, reducing contamination of the surface of the NiO layer, and reducing cycle time to improve system throughput.

A continuous flow deposition process is defined where a first wafer is inserted and aligned for the first IBS deposition chamber. The first wafer is moved into the first IBS deposition chamber where the reactive sputter deposition process is carried out. The first wafer is then moved from the first IBS deposition chamber to the wafer aligner, aligned for the second IBS deposition chamber and moved into the second IBS deposition chamber for metal layer deposition processing. A second wafer is then inserted, aligned and moved into the first IBS deposition chamber where reactive sputter deposition is carried on simultaneously with the metal layer depositions on the first wafer in the second IBS deposition chamber. After the metal layer depositions on the first wafer have been completed, the first wafer is moved out of the second IBS deposition chamber and placed in the wafer stack at the access chamber. The second wafer is then moved from the first IBS deposition chamber to the aligner and then into the second IBS deposition chamber. A third wafer is then inserted into the system to continue the process flow. During each wafer transport step, the first and second IBS deposition chambers are isolated from each other by appropriate gate valve closures to minimize cross-contamination. The vacuum pumps in each part of the system are used to achieve the desired low pressure conditions during the processing sequence.

The processing sequence of the ion beam sputter deposition system is remotely controlled by a computer system programmed by a software program. The software program controls the opening and closing of gate valves, vacuum pump operation, wafer handler movements and ion beam sputter deposition processes in order to maintain an efficient process flow under the desired operating conditions. Improved exchange coupling properties of the NiO AFM layer in the SV sensors is achieved by controlling the completion of the reactive sputter deposition of the NiO layer to availability of the second IBS deposition chamber for the subsequent metal deposition process to minimize the time during which the NiO surface may be contaminated.

The above as well as additional objects, features, and advantages of the present invention will become apparent in the following detailed written description.

BRIEF DESCRIPTION OF THE DRAWINGS

For a fuller understanding of the nature and advantages of the present invention, as well as the the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
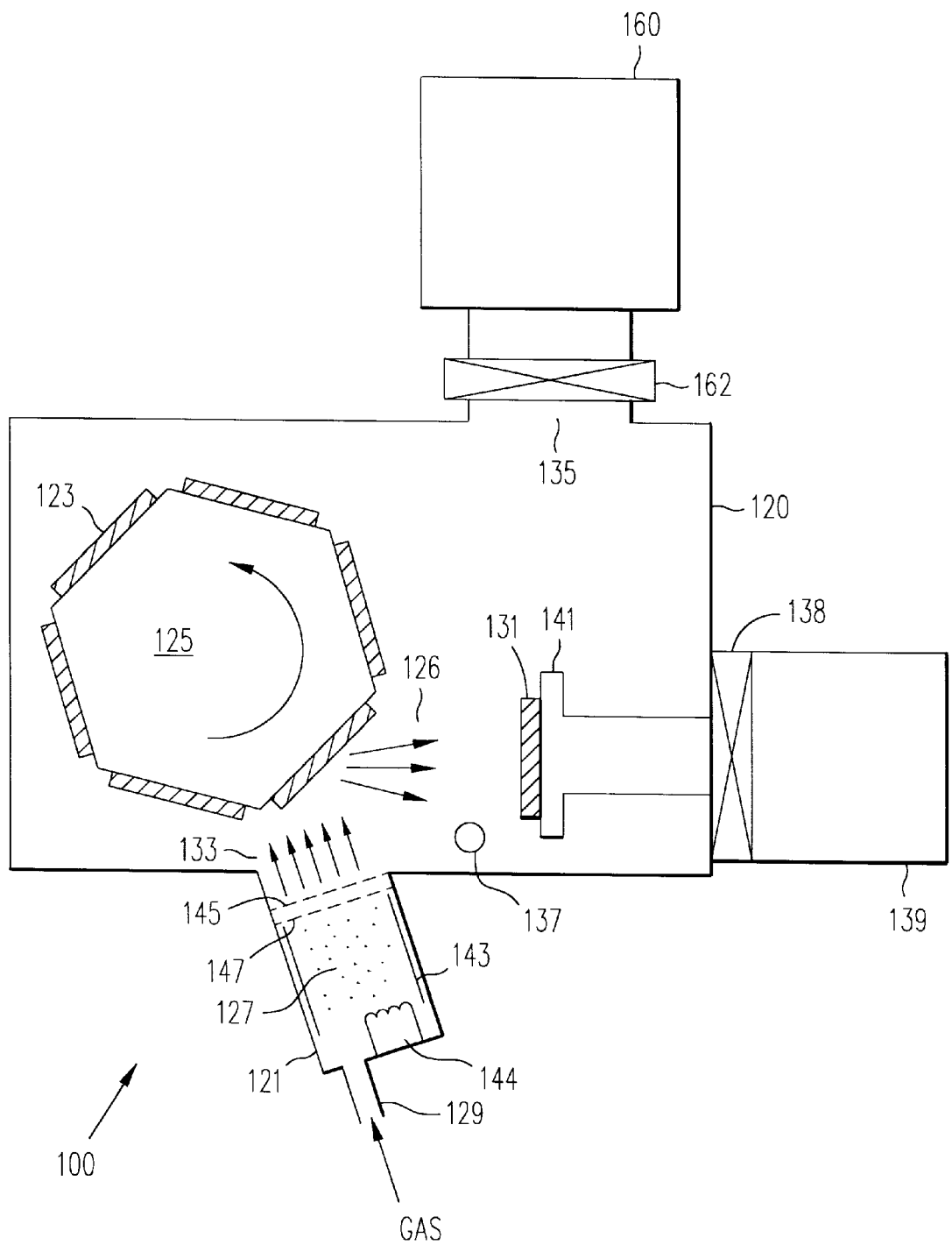
FIG. 1 is a block diagram of a prior art ion beam sputtering deposition system.
Figure 2:
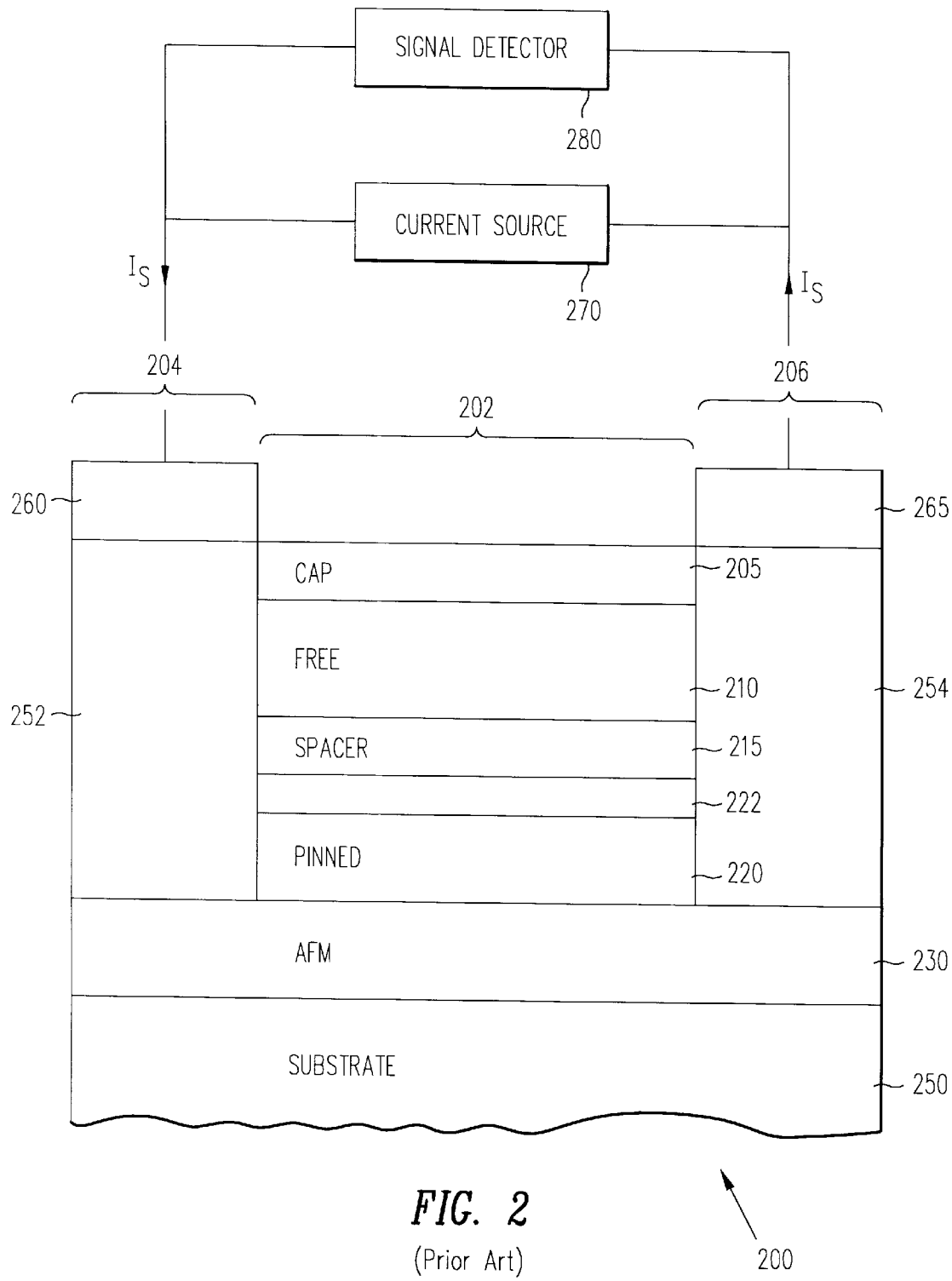
FIG. 2 is an air bearing surface view, not to scale, of a prior art SV sensor.
Figure 3:
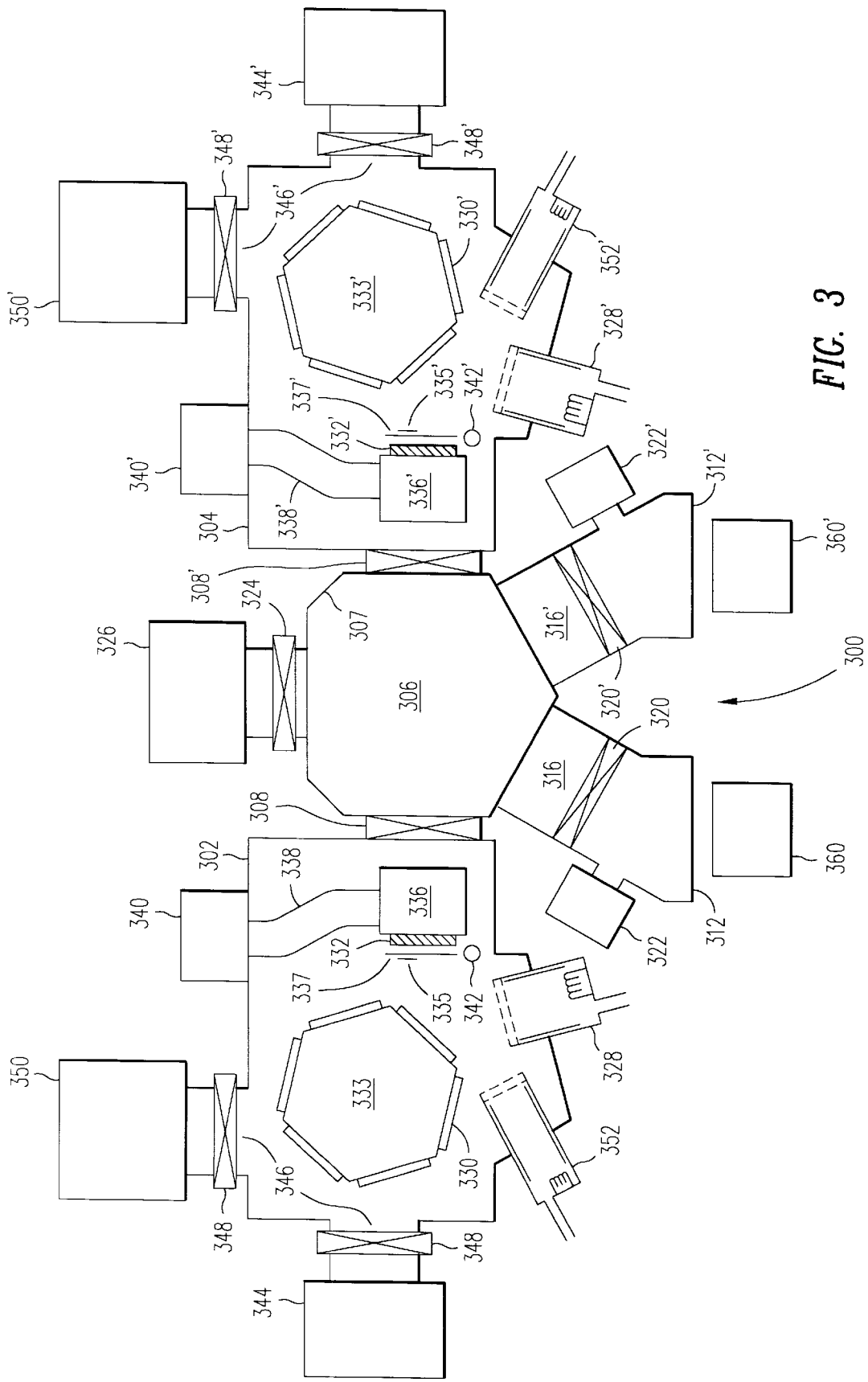
FIG. 3 is a top view of a preferred embodiment of a dual chamber deposition system according to the present invention.

Referring now to FIG. 3, there is shown a top view of a dual chamber deposition system 300 of the preferred embodiment of this invention. The dual chamber deposition system 300 comprises a first IBS deposition chamber 302, a second IBS deposition chamber 304, and a wafer handler chamber 306 disposed between and connected to the first and second IBS deposition chambers 302, 304 by gate valves 308 and 308', respectively. In FIG. 3, the parts in the second IBS deposition chamber 304 that are like or similar to parts in the first IBS deposition chamber 302 are designated by the same numbers with a prime added. The first IBS deposition chamber 302 and the second IBS deposition chamber 304 are substantially identical ion beam sputter deposition modules each comprising an ion beam source 328, a rotary target support 333 supporting a plurality of targets 330, and a substrate 332 mounted on a movable substrate stage 336. The substrate stage 336 is fixed to a stage support arm 338 connected to a stage angle drive 340 mounted on the IBS deposition chamber 302. The stage angle drive 340 can be rotated approximately 90° to change the substrate stage 336 orientation to position the substrate 332 from facing the rotary target support 333 (as shown in FIG. 3) to facing upward (out of the page) for accessibility through the gate valve 308. The substrate stage 336 may also be rotated during deposition, using a rotary/linear motor, to rotate the deposition substrate 332 to improve deposited film uniformity. The IBS deposition chamber 302 is evacuated and maintained at a suitable low pressure by a cryogenic vacuum pump 350 and a turbomolecular vacuum pump 344 via some ports 346 fitted with some gate valves 348.

The IBS deposition chambers 302 also include ion beam etch guns 352 for producing and directing a beam of ions at the surface of the substrate 332 in order to remove contamination prior to film deposition onto the substrate. A thickness monitor 342 positioned closely adjacent to the substrate 332 provides real-time, in-situ monitoring of the thickness of the growing film during deposition. A flux regulator 335 fixed in front of the deposition substrate 332 partially blocks the sputtered atom flux from the target 330 and is used in conjunction with rotation of the deposition substrate 332 to improve thickness uniformity of the deposited layer. A magnetic field may also be applied at the substrate 332 if required for the particular structure being deposited. A target shutter (not shown) and a substrate stage shutter 337 for covering the target 330 and substrate 332 surfaces, respectively, are included for prevention of surface contamination during sputter cleaning processes.

The wafer handler chamber 306 provides a means for moving the substrate 332 in to and out of the dual chamber deposition system 300 and moving the substrate 332 in and out of the first IBS deposition chamber 302, or in and out of the second IBS deposition chamber 304, or between the first and second IBS deposition chambers 302 and 304. The wafer handler chamber 306 includes a vacuum chamber 307, a first access chamber 312 and a second access chamber 312' for accepting a substrate (wafer) stack 360 for holding a plurality of substrates (12 wafers in the preferred embodiment). After the substrate stack 360 is placed in the first access chambers 312, a vacuum pump 322 reduces the pressure in the access chamber with closed gate valve 320 providing isolation from the vacuum chamber 307. The vacuum chamber 307 is maintained at a suitable low pressure by a cryogenic vacuum pump 326 via a port and gate valve 324 as is well known in the art. A first wafer aligner 316 positioned adjacent to the first access chamber 312 provides the means to rotate the substrate 332 to align a reference notch on the wafer circumference to a predetermined position for film depositions in the first IBS deposition chamber 302 or to another predetermined position for film depositions in the second IBS deposition chamber 304. A second wafer aligner 316' positioned adjacent to the second access chamber 312' may be used to align substrates inserted into the second access chamber 312', or alternatively, a single wafer aligner may be used for substrates inserted in both access chambers by using the moving means of the wafer handler chamber 306 to move the substrate to the first wafer aligner 312.

Figure 4:
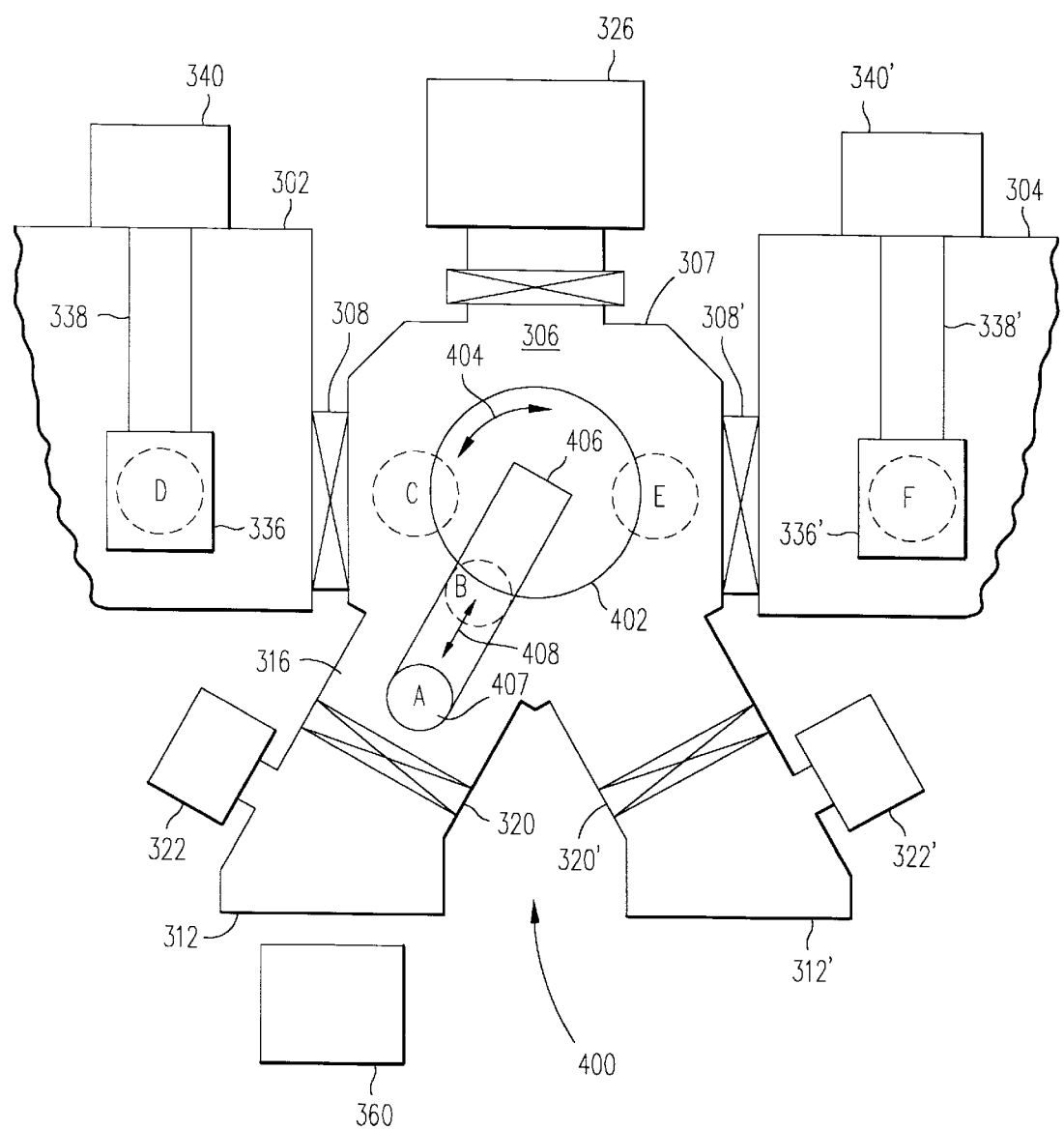
FIG. 4 is a top view of the wafer handling chamber portion of the dual chamber deposition system.

Referring now to FIG. 4, there is shown the central portion 400 of the dual chamber deposition system 300 to show more detail of the wafer handling chamber 306. The wafer handling chamber 306 includes a turntable 402, centrally fixed in the vacuum chamber 307, supporting a mechanical linear translator 406 having a substrate holder 407 fixed on the distal end of the translator. The turntable 402 may be rotated, using a rotary motor, in either a clockwise or a counterclockwise sense as indicated by the arrow 404. The linear translator 406 may be extended or retracted, using a rotary/linear motor drive, to move the substrate holder 407 in a radial sense relative to the center of the turntable 402 as indicated by the arrow 408 as is well known in the art.

Movement of a substrate (wafer) within the dual chamber deposition system 300 is accomplished by a sequential series of linear radial translations by the linear translator 406 and angular rotations by the turntable 402. For example, to move a substrate on substrate holder 407 in position A from the wafer aligner 316 to the substrate stage 336, the translator 406 is retracted to position the substrate at B, then the turntable 402 is rotated clockwise to position the substrate at C, and then the translator 406 is extended through the open gate valve 308 to place the substrate on the substrate stage 336 at position D. Similarly, the substrate may be moved via position E through the open gate valve 310 onto the substrate stage 336' at position F in the second IBS deposition chamber 304.

During operation of the dual chamber deposition system 300, continuous process flow may be maintained by first loading a first wafer stack 360 into the first access chamber 312 and then a second wafer stack 360' into the second access chamber 312'. When all the substrates in the first access chamber 312 have been processed, the substrates in the second access chamber 312' are processed while the substrate stack 360 is replaced by a new substrate stack in the first access chamber 312.

Using the dual chamber deposition system of the present invention to deposit a spin valve sensor structure including a NiO AFM layer has provided a means to fabricate SV sensors with improved exchange coupling and improved GMR coefficients in a manufacturable process. The use of NiO for the AFM layer in a SV sensor is desirable because of the good corrosion resistance of NiO and its relatively high blocking temperature (blocking temperature is the temperature at which the pinning field for a given material reaches zero). However, fabrication of NiO SV sensors using the prior art single chamber ion beam deposition systems results in unacceptably low deposition system throughput due to the long time needed to pump out the oxygen containing gas used in the reactive sputter depositions and to sputter clean the oxygen contaminated targets for subsequent metal layer depositions. Improvement in throughput can be achieved by batch processing the reactive sputter depositions on a sequence of wafers, however these process sequences result in long and varied hold times for the exposed NiO surfaces.

TABLE 1

Effect of NiO hold time in vacuum on SV sensor properties

| Hold Time (minutes) | $H_e$ (Oe) | dR/R (%) | $H_{ex}$ (Oe) | $H_p$ (Oe) |
|---|---|---|---|---|
| 5–10 | 15 | 5.77 | 250 | 450 |
| 75 | 19 | 5.41 | 150 | 200 |
| 150 | 35 | 4.3 | 75 | 100 |

Where
$H_e$ = ferromagnetic coupling field
dR/R = magnetoresistance coefficient

TABLE 1-continued

Effect of NiO hold time in vacuum on SV sensor properties

| Hold Time (minutes) | $H_e$ (Oe) | dR/R (%) | $H_{ex}$ (Oe) | $H_p$ (Oe) |
|---|---|---|---|---|

$H_{ex}$ = exchange field
$H_p$ = pinning field

Table 1 shows the results of experiments by the present inventor on the effect of the hold time elapsing between deposition of the NiO AFM layer and the deposition of the Ni—Fe pinned layer onto the NiO surface held in a vacuum environment. These results show that to consistently produce SV sensors with good exchange properties, a high priority must be put on process sequences that maintain a constant minimal hold time before pinned layer deposition. Using the prior art single chamber ion beam deposition system, the hold time is typically in the range of 5–10 minutes for a process run to completion on a single wafer. This hold time results in acceptable exchange properties, however the system throughput is very low (approximately 6 wafers/day). Using improved throughput processing sequences results in hold times exceeding 20 minutes and unacceptably large variations in the hold times for the wafers.

Use of the dual chamber deposition system of the present invention for deposition of NiO SV sensors layers provides a means of significantly increasing system throughput while maintaining or improving the SV sensor properties. This improvement is achieved by dedicating one IBS deposition chamber of the system to the reactive gas sputtering deposition processes and dedicating the second IBS deposition chamber of the system to the metal layer inert gas sputter depositions. A continuous flow process is then used which prioritizes maintaining a constant minimal hold time for NiO layer coverage for all wafers.

Figure 5:
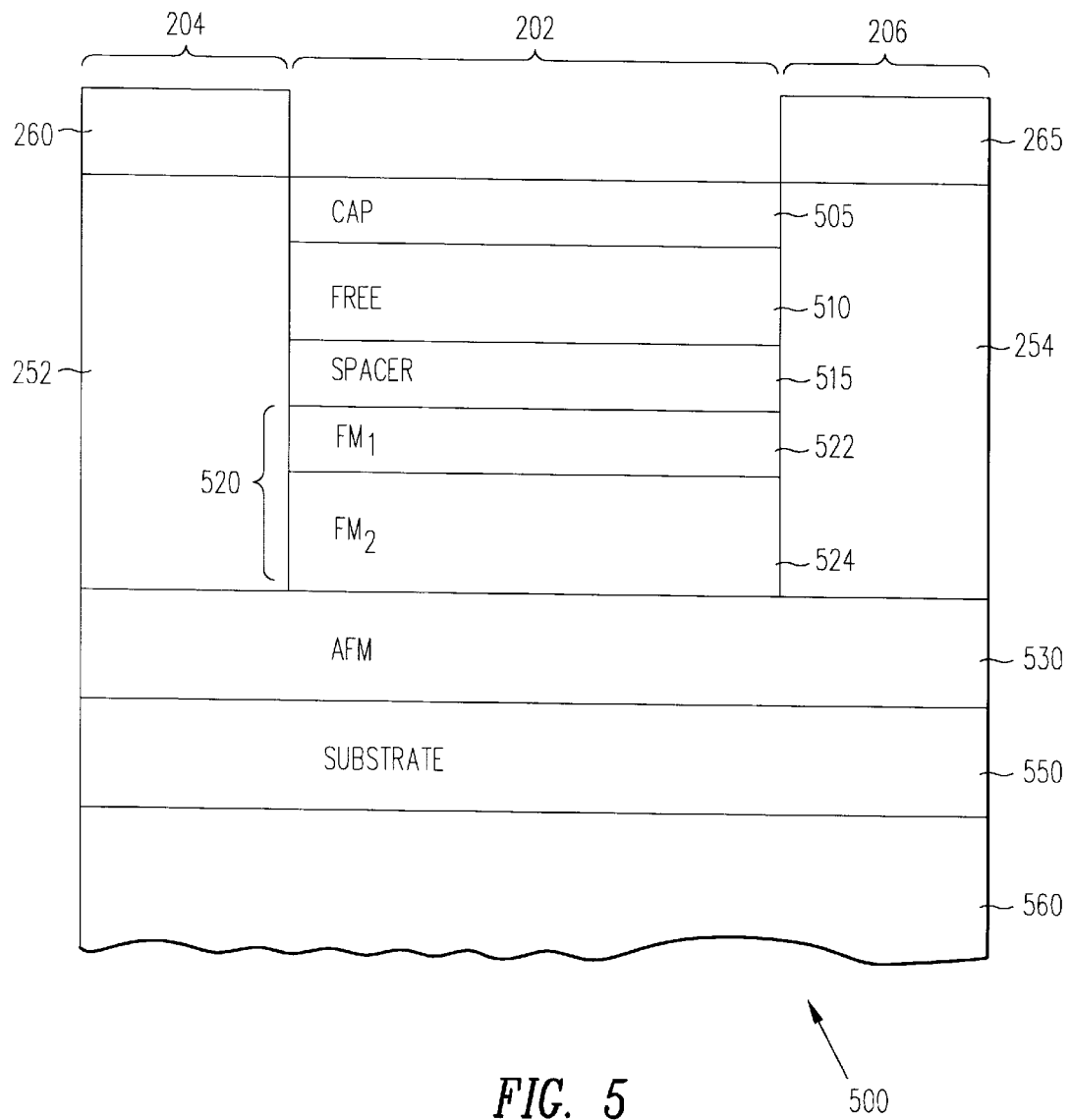
FIG. 5 is an air bearing surface view , not to scale, of an improved SV sensor having a NiO AFM layer.

Referring now to FIG. 5, there is shown an SV sensor 500 having an AFM layer made of NiO fabricated using the dual chamber deposition system 300 of the present invention to deposit the multiple films of the structure. The SV sensor 500 comprises a substrate layer 550 formed of $Al_2O_3$, an AFM layer 530 formed of NiO, a pinned layer 520 consisting of a second ferromagnetic sub-layer (FM2) 524 formed of Ni—Fe and a first ferromagnetic sub-layer (FM1) 522 formed of Co, a spacer layer 515 formed of Cu, a free layer 510 formed of Ni—Fe, and a cap layer 505 formed of Ta. A wafer (substrate) 560 was moved into the first IBS deposition chamber 302 of the dual chamber deposition system 300 (FIG. 3) and the substrate layer 550 was deposited on the wafer 560 by sputtering an Al target in the presence of a reactive oxygen containing gas to form an $Al_2O_3$ layer. The AFM layer 530 was deposited onto the substrate layer 550 by sputtering a Ni target in the presence of a reactive oxygen containing gas to form a NiO layer. The wafer 560 was then moved into the second IBS deposition chamber 304 of the dual chamber deposition system 300 for deposition of the remaining layers of the SV sensor structure using inert gas to sputter the various metallic targets. The FM2 layer 524, FM1 layer 522, spacer layer 515, free layer 510 and cap layer 505 were sequentially deposited over the AFM layer 530 in the second IBS deposition chamber.

Using the continuous flow process described above, with separation of the reactive gas sputtering processes and the inert gas metal layer depositions into separate IBS deposition chambers, resulted in fabrication of SV sensors 500 having consistently good properties while achieving significantly higher deposition system throughput. The hold time is reduced to the range of 2–5 minutes from the prior 5–10 minutes, and the throughput is increased to a range of 40–60 wafers per day from the prior approximately 6 wafers per day. These improvements in SV sensor performance consistency and deposition system throughput provide a usable fabrication process for these NiO SV sensors.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

I claim:

1. A process for making spin valve (SV) magnetoresistive sensors in a dual chamber deposition system including a first IBS deposition chamber, a second IBS deposition chamber and a wafer handler chamber, said process comprising the steps of:

a) reactive sputter depositing an antiferromagnetic (AFM) layer on a substrate in said first IBS deposition chamber;

b) moving said substrate under vacuum conditions from said first IBS deposition chamber to said second IBS deposition chamber; and c) sputter depositing a first ferromagnetic layer on said AFM layer in said second IBS deposition chamber after a controlled hold time, said controlled hold time being a time interval between completion of the reactive sputter deposition step of said AFM layer in said first IBS deposition chamber and start of the sputter deposition step of said first ferromagnetic layer in said second IBS deposition chamber.

2. The process as recited in claim 1, further comprising the step of depositing a layer of non-magnetic, electrically conducting material on said first ferromagnetic layer in said second IBS deposition chamber.

3. The process as recited in claim 2, further comprising the step of depositing a second ferromagnetic layer on said non-magnetic, electrically conducting layer in said second IBS deposition chamber.

4. The process as recited in claim 1, wherein said AFM layer is made of NiO.

5. The process as recited in claim 1, wherein said controlled hold time is in the range of 2–5 minutes.

6. A process for making spin valve (SV) magnetoresistive sensors in a dual chamber deposition system including a first IBS deposition chamber, a second IBS deposition chamber and a wafer handler chamber, said process comprising the steps of:

a) moving a substrate from said wafer handler chamber into said first IBS deposition chamber;

b) reactive sputter depositing an antiferromagnetic (AFM) layer on said substrate in said first IBS deposition chamber;

c) moving said substrate under vacuum conditions from said first IBS deposition chamber to said second IBS deposition chamber;

d) sputter depositing a ferromagnetic pinned layer on said AFM layer in said second IBS deposition chamber after a controlled hold time, said controlled hold time being a time interval between completion of the reactive sputter deposition step of said AFM layer in said first IBS deposition chamber and start of the sputter deposition step of said ferromagnetic pinned layer in said second IBS deposition chamber;

e) sputter depositing a spacer layer on said ferromagnetic pinned layer in said second IBS deposition chamber; and f) sputter depositing a ferromagnetic free layer on said spacer layer in said second IBS deposition chamber.

7. The process recited in claim 6, wherein said AFM layer is made of NiO.

8. The process recited in claim 6, wherein said ferromagnetic pinned layer consists of a first ferromagnetic sublayer made of cobalt (Co) and a second ferromagnetic sublayer made of NiFe, said second ferromagnetic sublayer disposed between said AFM layer and said first ferromagnetic sublayer.

9. A process for making spin valve (SV) magnetoresistive sensors in a dual chamber deposition system including a first IBS deposition chamber, a second IBS deposition chamber and a wafer handler chamber, said process comprising the steps of:

a) dedicating the first IBS deposition chamber to reactive sputter depositions;

b) dedicating the second IBS deposition chamber to inert gas sputter depositions;

c) moving a substrate to the first IBS deposition chamber;

d) reactive sputter depositing an antiferromagnetic (AFM) layer on the substrate in the first IBS deposition chamber;

e) moving the substrate to the second IBS deposition chamber; and f) inert gas sputter depositing a ferromagnetic pinned layer, a spacer layer and a ferromagnetic free layer sequentially on said AFM layer.

* * * * *